United States Patent

Blood

(10) Patent No.: US 6,611,432 B2
(45) Date of Patent: Aug. 26, 2003

(54) DOCKING BRACKET FOR RACK-MOUNTED COMPUTING MODULES

(75) Inventor: Roger M Blood, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 39 days.

(21) Appl. No.: 09/770,370

(22) Filed: Jan. 26, 2001

(65) Prior Publication Data

US 2002/0101721 A1 Aug. 1, 2002

(51) Int. Cl.[7] .................................................. G06F 1/16
(52) U.S. Cl. ....................... 361/724; 361/725; 361/726; 361/727
(58) Field of Search .................................. 361/724–727

(56) References Cited

U.S. PATENT DOCUMENTS

| | | | | |
|---|---|---|---|---|
| 5,155,663 A | * | 10/1992 | Harase | 361/395 |
| 5,477,415 A | | 12/1995 | Mitcham et al. | 361/686 |
| 5,596,728 A | * | 1/1997 | Belmont | 395/281 |
| 5,627,974 A | | 5/1997 | Watts, Jr. et al. | 395/281 |
| 5,636,342 A | | 6/1997 | Jeffries | 395/185.01 |
| 5,913,034 A | * | 6/1999 | Malcolm | 395/200.53 |
| 6,009,479 A | | 12/1999 | Jeffries | 710/8 |
| 6,029,215 A | | 2/2000 | Watts, Jr. et al. | 710/101 |
| 6,084,769 A | * | 7/2000 | Moore et al. | 361/687 |
| 6,159,024 A | | 12/2000 | Münch et al. | 439/92 |
| 6,160,699 A | | 12/2000 | Gibson et al. | 361/643 |

OTHER PUBLICATIONS

U.S. Pending patent application Ser. No. 09/473,851 entitled "System and Method for Device Configuration and Management Using a Universal Serial Bus Port" filed by Frazier and assigned to Dell USA, L.P. (DC–02013), filed Dec. 27, 1999.

U.S. Pending patent application Ser. No. 09/229,736 entitled "Communications System for Multiple Computer System Management Circuits" filed by Bassman, et al. (DC–01491), filed Jan. 13, 1999.

U.S. Pending patent application entitled "System and Method for the Handling of System Management Interrupts in a Multiprocessor Computer System" filed by Nguyen, et al. and assigned to Dell Products L.P. (DC–02026), filed Jan. 24, 2001.

* cited by examiner

Primary Examiner—Darren Schuberg
Assistant Examiner—Yean Hsi Chang
(74) Attorney, Agent, or Firm—Baker Botts L.L.P.

(57) ABSTRACT

A docketing bracket (10) for rack-mounted computing devices (22). The docking bracket (10) is designed to fit inside one or more shelves of a rack (20). It may contain circuitry that would otherwise be contained in the computing equipment, such as a systems management unit (14) when the computing equipment is a server (22). The bracket (10) has an inner size and shape that generally conforms to the outer sides and back of the computing device (22). It has grooves (31) or other means for holding the computing device (22) while the computing device (22) is installed in the rack (20).

22 Claims, 2 Drawing Sheets

DOCKING BRACKET FOR RACK-MOUNTED COMPUTING MODULES

TECHNICAL FIELD OF THE INVENTION

This invention relates to rack-mounted computing systems, and more particularly to a docking bracket for rack-based computing modules.

BACKGROUND OF THE INVENTION

Many of today's more complex computing systems are designed as "rack mounted" systems. The "rack" is a frame into which computer-related modules may be stacked in a shelf-like manner. Typically, each module is housed in a chassis especially sized for one or more shelves of the rack. Each module may then be slid, rear end first, into the shelf. The front end of each module faces out from the front of the rack.

Some rack-based systems, such as computer server systems, may consist of numerous types of modules. These may include CPU-based modules, storage units, I/O drawers, and power units. A "server farm" in today's computing environment might have numerous racks, holding numerous types of computer-related modules.

For maintenance purposes, it is often desired to remove and repair or replace an entire computing module from the rack. In such situations, it is advantageous to minimize down time and the effect of the replacement on the overall system operation.

SUMMARY OF THE INVENTION

One aspect of the invention is a docking bracket for use with a rack that holds computing modules. The docking bracket is generally U-shaped. A rear portion has a length slightly smaller than the width of the rack, and a pair of side portions each have a length no longer than the depth of the rack. The docking bracket houses various electronic circuitry that would otherwise be housed in the chassis of the computing module. For example, it may house a systems management unit with a connector for connection to a computing module. The docking bracket further has means, such as grooves or ridges, for slidable installation of the computing module into the docking bracket.

The invention provides a docking system for easy replacement of the modules of a rack mounted system. Instead of placing the modules onto L-iron rails, the modules are slid into a "smart" docking bracket.

Various functions that are conventionally housed within the chassis of a server of other computer-based module, may be moved to the docking bracket. For example, the docking bracket may house a processor-based systems management unit, which would otherwise be housed in the module. This permits the module to be removed without disrupting systems management functionality.

The re-location of various functionality to the docking bracket from servers or other rack-mounted equipment, reduces the complexity of such equipment. They then become less expensively replaceable.

DETAILED DESCRIPTION OF THE INVENTION

Figure 1:
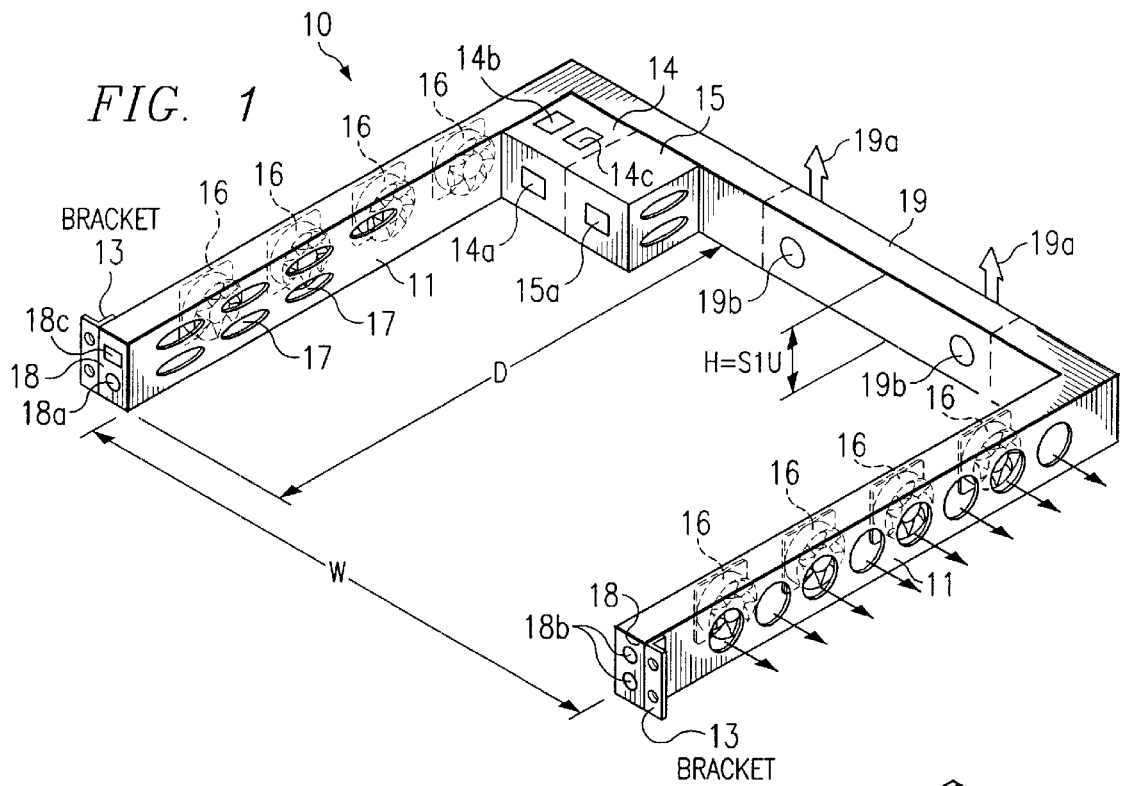
FIG. 1 illustrates a docking bracket in accordance with the invention.

FIG. 1 illustrates a docking bracket 10 in accordance with the invention. As explained below, docking bracket 10 conforms to, and is placed against, the rear and side dimensions of a rack-based computer-related device, such as a CPU-based unit, storage unit, power unit, or other peripheral (herein collectively referred to as "computing devices"). Examples of rack-based computing units with which docking unit 10 is used are server units, as well as peripheral units such as data storage equipment.

Docking bracket 10 is generally U-shaped, made from a rigid material, such as hard plastic or metal. Its rear portion 12, as well as either or both of its side portions 11 may be tubular, as is shown in FIG. 1. As explained below, a tubular configuration permits docking bracket 10 to contain various types of electronic circuitry. In alternative embodiments, if either or both side portions 11 or the rear portion 12, do not contain electronic circuitry, that portion may be planar. For example, a side portion 11 not containing fans 16 could be made from a straight bar of material.

Figure 2:
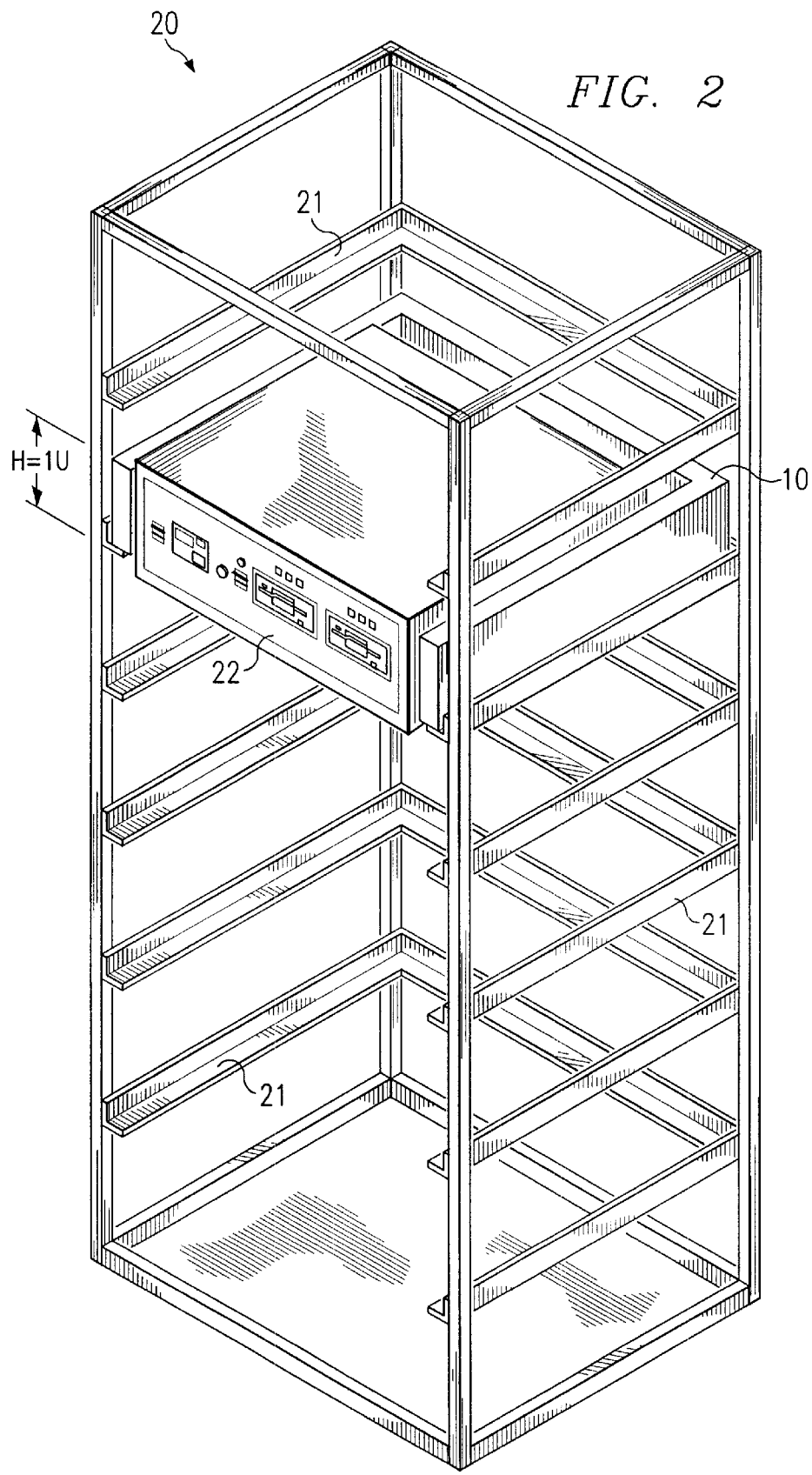
FIG. 2 illustrates a rack having a docking bracket and computing modules installed in one of its shelves.

FIG. 2 illustrates a computer component rack 20, having a number of shelves, into which rack-based computer components may be mounted. Referring to both FIGS. 1 and 2, docking bracket 10 has outer dimensions that permit it to fit into a shelf of rack 20. Thus, the rear portion 12 of docking bracket 10 has a length at least slightly shorter than the inner width of rack 20. The side portions 11 of docking bracket are no longer than the depth of rack 20.

Typically, each shelf of rack 20 is a standard width and height. A well known standard is the "U" standard, whereby chassis sizes for various modules have heights in 1.75 inch increments. For example, a 1U module is no more than 1.75 inches in height. In the example of FIGS. 1 and 2, docking bracket has a height, H, for holding a computing device whose chassis height is 1U.

The inner dimensions of docking bracket 10 generally conform to the outer dimensions of the sides and rear of whatever computing device is to be installed in the rack 20. Thus, server 22 has a chassis size whose rear width is only slightly smaller than the inner width, W(inner), of bracket 10, and whose sides are no longer than the inner depth, D(inner), of bracket 10.

In FIG. 2, a computer module 22 is mounted in one of the shelves of rack 20. Typically, rack 20 has L-shaped rails 21 along its back and sides for holding modules having standard size chassis. Docking bracket 10 may be sized so that it rests on these rails 21. Additionally or alternatively, docking bracket 10 is affixed to the sides and rear of rack 20, such as by means of bolts or welding or other mechanical attachment means. In the example of FIG. 1, docking bracket 10 has brackets 13, which may be bolted to the rack 20.

The attachment of docking bracket 10 to rack 20 may be a removable or a permanent attachment. With docking bracket 10 thus installed, module 22 may be easily slid into the docking bracket 10. If module 22 is to be removed for service, it may be slid forward out of docking bracket 10.

Referring to both FIGS. 1 and 2, docketing bracket 10 houses a systems management unit 14. Systems management unit 14 is a processor-based unit, which is coupled to the server 22 via the server bus. Management unit 14 monitors operating conditions of server 22 and is in communication with a management system (not shown). Management unit 14 delivers operating information to the management system. One type of operating conditions that may be monitored by management unit 14 include environmental conditions such as internal temperature and operating parameters of equipment such as fans. Other types of operating conditions are power supply parameters and security parameters such as chassis intrusion. The system management unit 14 may receive operating information from the operating system of the server. Systems management unit 14 might also be programmed to initiate server functions, such as a reboot or shutdown.

An example of programming for system management unit 14 is the programming implemented for the EMS (embedded systems management) unit, a product of Dell Computer Corporation, heretofore implemented as programming in a systems management unit internal to a server.

In the example of FIG. 1, the connection from systems management unit 14 to the server 22 would be via an ISA (Industry Standard Architecture) bus connection 14a at the inner face of the docking bracket 10. A connection 14b to the central system management unit, such as an Ethernet connection, is at the outer face of docketing bracket 10. Systems management unit 14 also has an I/O interface 14c for input such as from a keyboard or mouse or for output such as to a video monitor.

If for any reason, server 22 is removed and disconnected from docking bracket 10, systems management unit 14 remains connected to the central systems management system. It may then continue to report on appropriate conditions. For example, in this situation, systems management unit 14 can report that the server is gone.

In conventional server units, the systems management functionality is housed in the server unit. However, a feature of the invention is that a server 22 to be mounted in rack 20 need not have a systems management unit internal to its chassis. Instead server 22 is connected to systems management unit 14 when it is placed into docking unit 10.

Docking bracket 10 also houses a power supply 15. Like systems management unit 14, power supply 15 is a unit that would otherwise be required in server 22 (or other computing device). Power supply 15 contains electronic circuitry, such as for AC to DC conversion, typically implemented in computer power supplies. Power supply 15 may be used to provide power for the circuitry of whatever electronics are installed in docking bracket 10, as well as for the circuitry of server 22 (or other computing module). A connector 15a connects the power supply 15 to the module 22 when the module is in the docking bracket 10.

In the example of FIG. 1, systems management unit 14 and power supply 15 occupy a box at one inner corner of docking bracket 10. In other embodiments, the circuitry for these units could be contained in the side or rear portions in a manner that would not require such a box. For example, the rear portion could be somewhat larger but have a uniform inner surface. Regardless of the location of the systems management unit 15 and power supply 15, their connectors 14a and 15a could be such that no manual connection is required. For example, a sliding male-female type connector could be used.

Fans 16 are housed in one or both of the side portions of docking bracket 10. They may be controlled by systems management unit 14, or by some other control housed in docking bracket 10. Holes 17 on the inner face of the side portions permit air to flow from fans 16 into the computing module, which would have corresponding openings in its chassis. In other embodiments, fans 16 could be placed in the rear portion.

The rear portion 12 of docking bracket 10 may house an interface 19 for connection of the module to other modules, to a network, or to various peripheral devices. For example, various external I/O connectors 19a may be housed in the rear portion 12 of docking bracket 10, for use when the module to be installed in docking bracket 10 is a server or other module that uses I/O. Internal connectors 19b are used to connect the module to the interface 19. A docking type connection may be used between the back of the module and connectors 19b so that no manual connection is required. For example, a male connector on the back of the module might simple slide into a female connector 19b. In other embodiments, the interface 19 could be housed in a side portion of docking bracket 10.

A front panel 18 at the front of one or both side portions of docking bracket 10 may have various controls or indicators. For example, a power control switch 18a may be connected to power supply 15. Examples of indicators are a power-on indicator light (connected to power supply 15) or various fault and status indicators 18b. Another type of indicator is an LED display 18c for displaying simple text messages.

Figure 3:
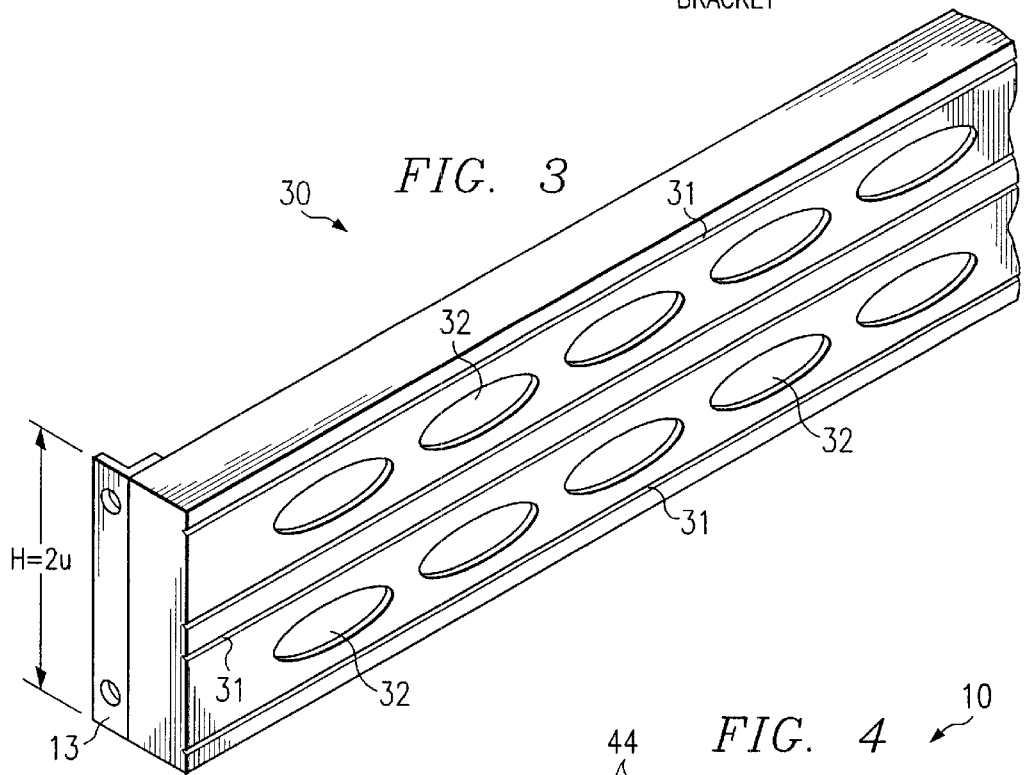
FIG. 3 illustrates the inner surface of a side portion of the docking bracket.

FIG. 3 illustrates a side portion of docking bracket 30 in further detail. In the example of FIG. 3, docking bracket is a 2U design, and may hold two 1U modules or a single 2U module. Otherwise, docking bracket 30 may have a structure similar to that described above in connection with docking bracket 10. Other versions of docking bracket 10 could be made in increasing heights, such as 3U or 4U designs. For purposes of this description, a docking bracket having dimensions appropriate for a 1U, 2U, 3U, . . . standard is referred to as complying with the "n"U standard.

Grooves 31 along the inner face of the side portion provide a mounting mechanism and guide for the docking of the server 22 (or other computing unit). Holes 32 permit air from fans 16 to enter into corresponding holes in the chassis of server 22 (or other computing unit).

If docking bracket 30 contains fans 16, grooves 31 may be designed to prevent air from leaking out of the interface between docking bracket 30 and server 22. If desired, when the computing unit to be installed into docking bracket 10 does not use fans, a panel (not shown) can be slid between grooves 31 to cover holes 32.

Grooves 31 are but one example of means for holding the server 22 (or other computing equipment) in the docking bracket 10 or 30. Ridges instead of grooves could be used for the same purpose, and could also be designed to seal air-flow between the docking bracket 10 and whatever module is placed into docking bracket 10.

Figure 4:
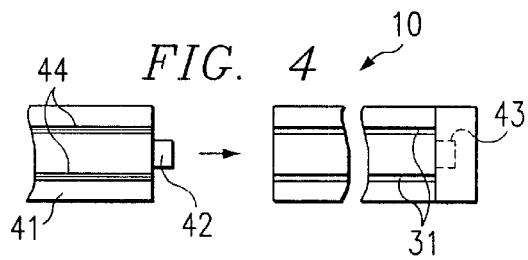
FIG. 4 is a partial view of the side of the rear of a chassis and the side of the docking bracket.

FIG. 4 is a partial side view of docking bracket 10 and the back of the chassis 41 of a computing module (such as a server). As illustrated, docking bracket 10 has grooves 31 and chassis 41 has corresponding ridges 44, which provide for a sliding installation of chassis 41 into docking bracket 10. Male connector 42 slides into female connector 43, as one example of the docking type connections discussed above.

A rack-based computing module housing system could be manufactured sold as a package, with a chassis 22 and docking bracket 10 having appropriate mechanisms (such as grooves and ridges) for a slidable and removable installation of the chassis into the docking bracket. The chassis 22 could have male connectors 42 built in, or it could be designed with openings for such connectors in a manner similar to personal computer chassis designed to hold cards on a motherboard.

Other Embodiments

Although the present invention has been described in detail, it should be understood that various changes, substitutions, and alterations can be made hereto without departing from the spirit and scope of the invention as defined by the appended claims.

What is claimed is:

1. A docking bracket for use in combination with a server module, for installation into a server rack, comprising:
    a rear portion having a length slightly smaller than the width of the rack;
    a pair of side portions, each extending from an opposing end of the rear portion and having a length no longer than the depth of the rack;
    wherein the rear portion and side portions form a three-sided enclosure;
    a systems management unit housed with the docking bracket, for providing electronic circuitry that would otherwise be required in the server module; and
    mechanical means on the side portions for slidably installing the server module into the docking bracket, such that the server module is supported by the bracket at the side of the server module;
    wherein the server module is fully functional only when installed in the bracket.

2. The docking bracket of claim 1, wherein the rear and side portions have a height generally conforming to an "n" U standard.

3. The docking bracket of claim 1, further comprising a power supply unit housed within the docking bracket.

4. The docking bracket of claim 1, further comprising an I/O interface housed within the docking bracket.

5. The docking bracket of claim 4, wherein the I/O interface has external connectors at an outer face of the docking bracket and internal connectors at an inner face of the docking bracket.

6. The docking bracket of claim 1, further comprising cooling fans housed within the docking bracket.

7. The docking bracket of claim 1, wherein at least one of the side portions has a front face at the front of the rack, and further comprising a front panel at the front face.

8. The docking bracket of claim 1, wherein the means for securing the computing module is one or more grooves along the inner surface of the side portions.

9. The docking bracket of claim 1, wherein the means for securing the computing module is one or more ridges along the inner surface of the side portions.

10. The docking bracket of claim 1, wherein at least one of the side portions has openings for providing ventilation for the computing module.

11. A modular rack-based computer housing system for a server, comprising:
    a server chassis for housing server computing equipment; and
    a docking bracket having a rear portion having a length slightly smaller than the width of the rack; a pair of side portions, each extending from an end of the rear portion and having a length no longer than the depth of the rack; wherein the rear portion and side portions form a three sided enclosure; a systems management unit housed with the docking bracket for providing electronic circuitry that would otherwise be required in the server chassis; and means for securing the server chassis in the docking bracket;
    wherein the chassis has mechanical means along its sides for slidable installation into the docking bracket, such that the chassis is supported by the bracket at the sides of the chassis.

12. The system of claim 11, wherein the chassis further has connectors for slidably mating with docking bracket.

13. The system of claim 11, wherein the chassis and the docking bracket have corresponding ventilation openings.

14. The system of claim 11, wherein the rear and side portions have a height generally conforming to an "n" U standard.

15. The system of claim 11, further comprising a power supply unit housed within the docking bracket.

16. The system of claim 11, further comprising an I/O interface housed within the docking bracket.

17. The system of claim 11, further comprising cooling fans housed within the docking bracket.

18. The system of claim 11, wherein at least one of the side portions has a front face at the front of the rack, and further comprising a front panel at the front face.

19. The system of claim 11, wherein the mechanical means for installing the chassis is one or more grooves along the inner surface of the side portions.

20. The system of claim 11, wherein the mechanical means for installing the chassis is one or more ridges along the inner surface of the side portions.

21. A method of mounting a server into a rack, comprising the steps of:
    attaching a docking bracket inside the rack, the docking bracket being generally U-shaped and having a back portion and side portions that generally conform to the inner dimensions of the back and sides of the rack, the docking bracket having a system management unit; and
    slidably installing a server module into the docking bracket, such that the server module is supported by the docking bracket at the sides of the server module;
    such that the server is functional only when the server module is installed in the docking bracket.

22. The docking bracket of claim 21, wherein the docking bracket has a height generally conforming to an "n" U standard.

* * * * *